United States Patent
Lindsay et al.

(10) Patent No.: US 6,732,352 B2
(45) Date of Patent: May 4, 2004

(54) SYSTEM AND METHOD FOR CREATING PROBE MASKS

(75) Inventors: Dean T. Lindsay, Milpitas, CA (US); Wayne C. Ashby, San Jose, CA (US); David A. Plettner, Cupertino, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 14 days.

(21) Appl. No.: 10/154,277

(22) Filed: May 23, 2002

(65) Prior Publication Data

US 2003/0221180 A1 Nov. 27, 2003

(51) Int. Cl.[7] .............................................. G06F 17/50
(52) U.S. Cl. ............................. 716/19; 716/15; 438/14; 438/26; 438/28
(58) Field of Search ........................ 716/15, 19; 700/84, 700/86; 438/745, 754, 14; 430/313; 382/144; 355/20; 29/842, 846; 250/234, 307, 491.1, 559.29; 361/762; 324/754; 257/48

(56) References Cited

U.S. PATENT DOCUMENTS

| | | | | |
|---|---|---|---|---|
| 3,739,232 A | * | 6/1973 | Grossman et al. | 361/762 |
| 4,295,198 A | * | 10/1981 | Copeland et al. | 382/144 |
| 5,162,240 A | * | 11/1992 | Saitou et al. | 427/8 |
| 5,191,708 A | * | 3/1993 | Kasukabe et al. | 29/846 |
| 5,307,560 A | * | 5/1994 | Aksu | 29/842 |
| 6,156,484 A | * | 12/2000 | Bassous et al. | 430/313 |
| 6,562,636 B1 | * | 5/2003 | Richmond et al. | 438/14 |
| 6,586,955 B2 | * | 7/2003 | Fjelstad et al. | 324/754 |
| 2003/0234393 A1 | * | 12/2003 | Cowles et al. | 257/48 |

FOREIGN PATENT DOCUMENTS

SU  1661695  * 7/1991  ........... G01R/31/02

OTHER PUBLICATIONS

"Micro Circuit Probing System", Apr. 1983, IBM Technical Disclosure Bulletin, US vol. No: 25, Issue No: 11A, p. No: 5690–56.*

IBM, "Micro Circuit Probing System", Apr. 1983, IBM Technical Disclosure Bulletin, vol. No: 25, Issue No: 11A, Pag No: 5690–5692.*

* cited by examiner

Primary Examiner—Vuthe Siek
Assistant Examiner—Helen Rossoshek

(57) ABSTRACT

Disclosed is a method and device for creating probe masks. In one embodiment, the mask aids in locating and accessing a pad on a PCB to allow for the measurement a signal at the pad using a probe. The mask is a perforated insulating sheet having holes corresponding to the spacing of at least some of the conductive pads on the PCB, and at least some of the holes are marked to aid in signal measurement. A processing system is used to assist in creating the markings.

19 Claims, 5 Drawing Sheets

US 6,732,352 B2

SYSTEM AND METHOD FOR CREATING PROBE MASKS

CROSS-REFERENCE TO RELATED APPLICATIONS

The present application is related to commonly assigned U.S. patent application Ser. No. 10/154,157 entitled "PROBE MASK FOR FACILITATING SIGNAL PROBING FOR TIGHTLY SPACED ARRAYS," filed concurrently herewith, which application is hereby incorporated by reference herein.

FIELD OF THE INVENTION

The invention relates generally to the probing of signals in a circuit and, more particularly, to a system and method for creating probe masks to facilitate reliable signal probing.

BACKGROUND OF THE INVENTION

FIG. 1 is a side view of a VLSI chip package 120 on an interposer 110 ready to be mounted on a PCB (Printed Circuit Board). The PCB couples to the interposer 110 at PCB surface 100. The interposer 110 acts as a conductive system between chip package 120 and the PCB.

To perform electrical analysis of signals to and from chips 120 mounted on a PCB, vias connected to these signals are extended through the PCB at the point where the chip attaches to the PCB. Vias are holes with plating to electrically connect features through the PCB. Conductive pads connected to these vias are then placed on the back side of the PCB. A user can measure the signal by contacting the pad using a test probe, such as that associated with an oscilloscope.

The pads on the PCB are typically small, numerous and closely spaced. For example, FIG. 2 illustrates a section of PCB 210 having approximately 1000 pads within one square inch. Each pad 220 is one oval shown in FIG. 2. Within each oval pad 220 is a via 200. Because a probe is relatively large in size compared to the pads, it is difficult to ensure the correct pad is being probed and that the probe is stabilized upon the pad.

FIG. 3 shows oscilloscope probe 300. Probe 300 has a body 330, an end 310 about the size of a ballpoint pen measuring approximately two and one-half inches in length, and a probe tip 320 measuring approximately one-half an inch in length. Probe tip 320 is used to contact and measure a signal at pad 220 (See FIG. 2). Some probes are quite large because of the electronics in the probe bodies, making it difficult to see the chip or the pad being measured.

Currently, a user must count over and up the number of pads to locate the pad to be measured and then place the probe upon that pad. There are a number of disadvantages associated with this standard method of locating the pad and measuring the signal at the pad. For example, locating the correct pad by counting up a number of pads and over a number of pads often requires the use of a magnifying glass to accurately count the pads. Moreover, once the first pad is located and a probe is placed upon the pad, it is difficult to locate and probe a subsequent pad(s) using another probe(s) at the same time because each additional probe further obscures the pads, making counting and probing increasingly difficult. Even if the user is able to keep track of the identified pad(s) for measurement, the probe tends to slide across the pad during measurement because of the pad's smooth surface. The pad is smooth because of the insulating solder that is silk-screened over the pads and vias. The probe's large size in comparison to the small area being measured makes handling the probe awkward and difficult to move towards the pad to be measured without losing track of the pad. Further, the repeatability of taking measurements diminishes because once the probe is removed from the pad, the pad must be relocated by counting and then remeasuring. Accordingly, currently it takes approximately 30 minutes to isolate and probe one pad.

BRIEF SUMMARY OF THE INVENTION

Embodiments of the present invention provide a system and method for creating a probe mask. In one embodiment, such masks are used as aids in locating and accessing a pad on a PCB to measure a signal at the pad using a probe. The preferred embodiment mask being a perforated insulating sheet having holes corresponding to the spacing of conductive pads on the PCB, and having created thereon markings to aid in signal measurement device to aid locating and accessing a pad on a PCB to measure a signal at the pad using a probe. In the preferred embodiment a processing system is used to assist in the creation, and/or identification, of the holes. The device being a perforated insulating sheet having holes corresponding to the spacing of conductive pads on the PCB.

DETAILED DESCRIPTION OF THE INVENTION

Figure 1:
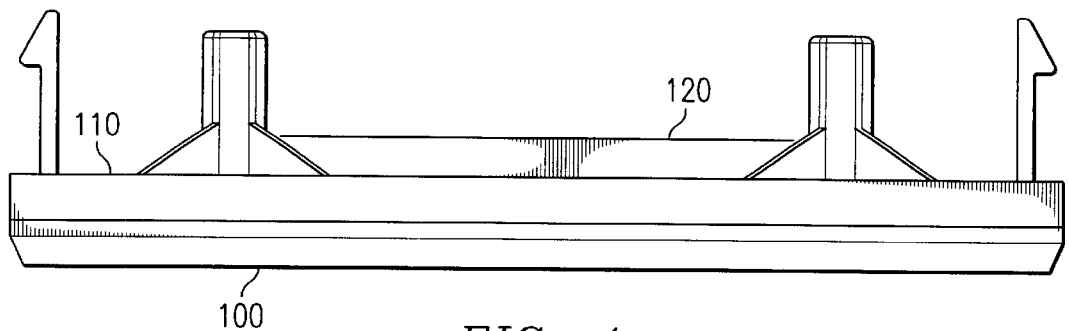
FIG. 1 is a side view of a VLSI chip configured for mounting on a PCB using an interposer.
Figure 2:
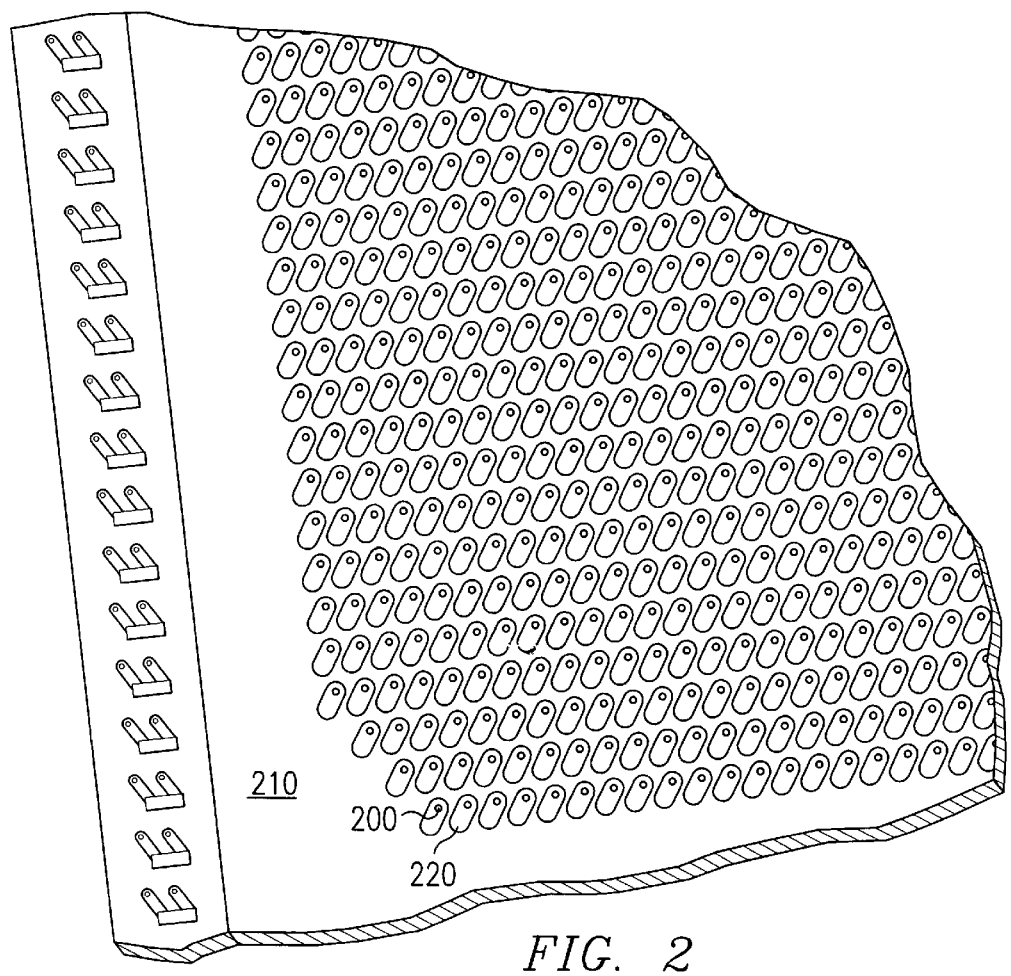
FIG. 2 is a plan view of conductive pads on a PCB.
Figure 3:
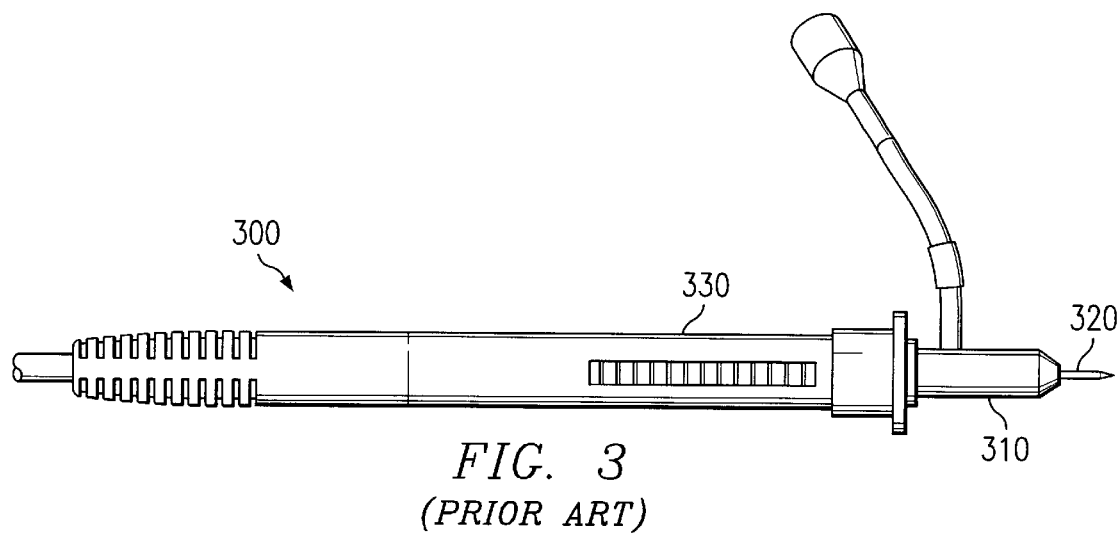
FIG. 3 is a perspective view of an oscilloscope probe.

The invention pertains to a perforated insulating sheet that can be held rigid in a frame creating a probe mask. The probe mask is preferably placed over the interconnections of a VLSI (Very-Large-Scale Integration) chip enabling a user to effectively and accurately locate and identify a pad on the VLSI chip and use a probe to measure the signal at the pad. The probe mask is advantageous because VLSI chips use extremely dense surface-mounted interconnection systems with very closely spaced pads making locating the pad itself difficult, as well as making it difficult to ensure that the probe remains on the pad during the measurement process. The present invention is a probe mask and method of use that allows for easy location of the pad to be probed, which minimizes the probe's likelihood of slipping from the pad.

Embodiments of the present invention provide various advantages over the prior art.

For example, use of preferred embodiments take a very short time, such as one minute or less, to identify and measure a particular pad. This provides a dramatic time savings over prior art methods of identifying and measuring the same pad. Moreover, the present invention provides for improved repeatability because a perforated insulating sheet of a preferred embodiment is marked to show the pad(s) to be measured. Accordingly, a user may simply place a preferred embodiment probe mask on the PCB to remeasure the signal at the pad.

Embodiments of the present invention are particularly useful on chips with 20×20 and larger pin fields. For example, when probe masks according to preferred embodiments are viewed at an angle, the perforated holes are easier to count and mark, thereby providing a solution which is particularly useful with respect to large pin fields.

Preferred embodiments of the present invention provide a perforated insulating sheet to facilitate the locating of a pad and/or to help stabilize a probe during measurement of a signal at the pad. The insulating sheet may be constructed of Mylar, Polyimide or other insulating materials. The insulating sheet may be held rigidly or tightly in a frame to create a probe mask. Additionally or alternatively, insulating sheets used according to the present invention may be rigid or semi-rigid, thereby providing a probe mask without a frame. One preferred embodiment of the probe mask uses an insulating sheet that is 0.005 inches thick.

A user can easily identify the pad to be measured by using the probe to tactilely count over and up the number of pads using the corresponding perforations in a probe mask of the present invention. Because the mask is perforated with holes corresponding to the spacing of the conductive pads on the PCB to be measured, a probe may be stepped through a series of perforations to reliably and accurately arrive at a perforation associated with a particular pad of interest. Specifically, the probe will preferably slide into the perforations while the user is counting, to hold the user's place on the mask, to locate the pad to be measured. In the prior art, the probe would slide over the pads as the user counted, invariably making the user lose count.

According to a preferred embodiment of the invention, a user or manufacturer may mark a perforation or perforations corresponding to conductive pads of interest. For example, once the user has identified the pad(s) to be measured he can mark the corresponding perforation. The marking on the probe mask may be circling the perforation with a marker. This allows a user to use different colors to identify different signals. Moreover, a user may use letters or numbers printed on the mask to identify the pad to be measured. Additionally or alternatively, probe masks of the present invention may be made with predetermined perforation patterns to correspond to particular pads of interest, such as where a particular signal is to be probed repeatedly. Several pads can be used in sequence, each pad having perforations only at the pads of interest for a particular test sequence. The desired perforation can be color coded, if desired, to indicate various expected signal characteristics, or to identify the sequence of steps to follow.

Figure 4:
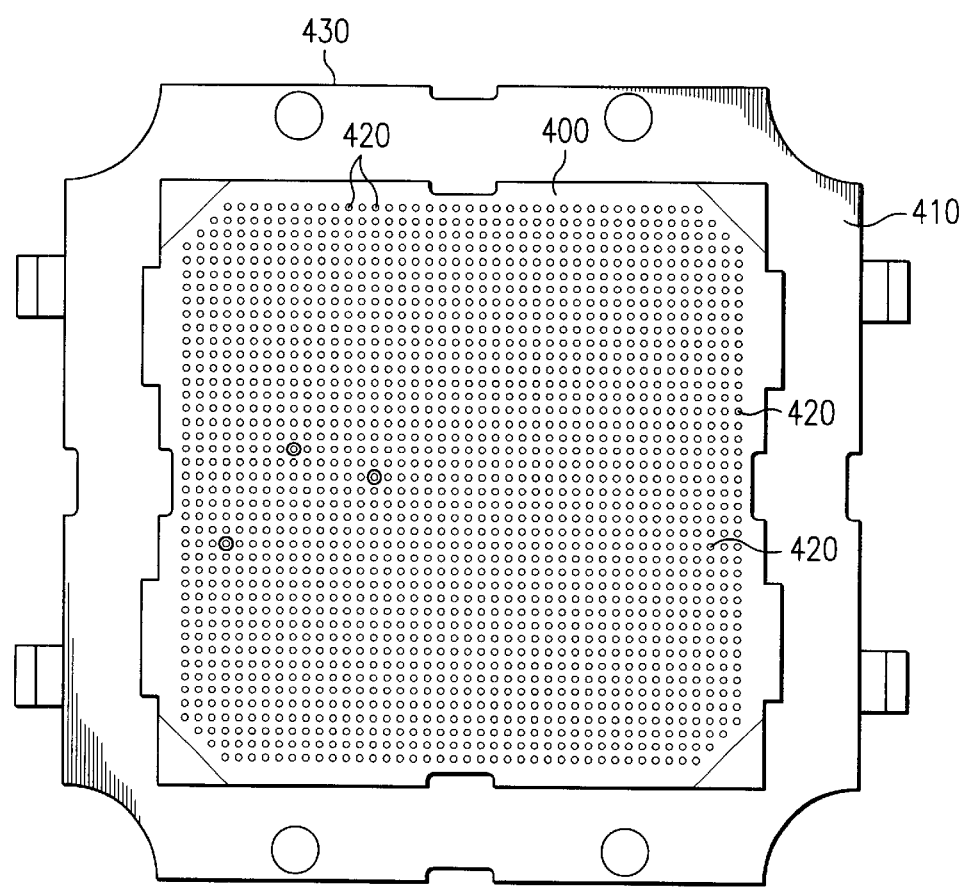
FIG. 4 is a plan view of a preferred embodiment perforated mask with holes marked for reference.

FIG. 4 shows a preferred embodiment perforated insulating sheet 400 held rigid in a frame 410 creating a probe mask 430 according to a preferred embodiment. To illustrate the marking of the insulating sheet, probe mask 430 is shown with three perforated holes 420 marked for measurement.

Figure 5:
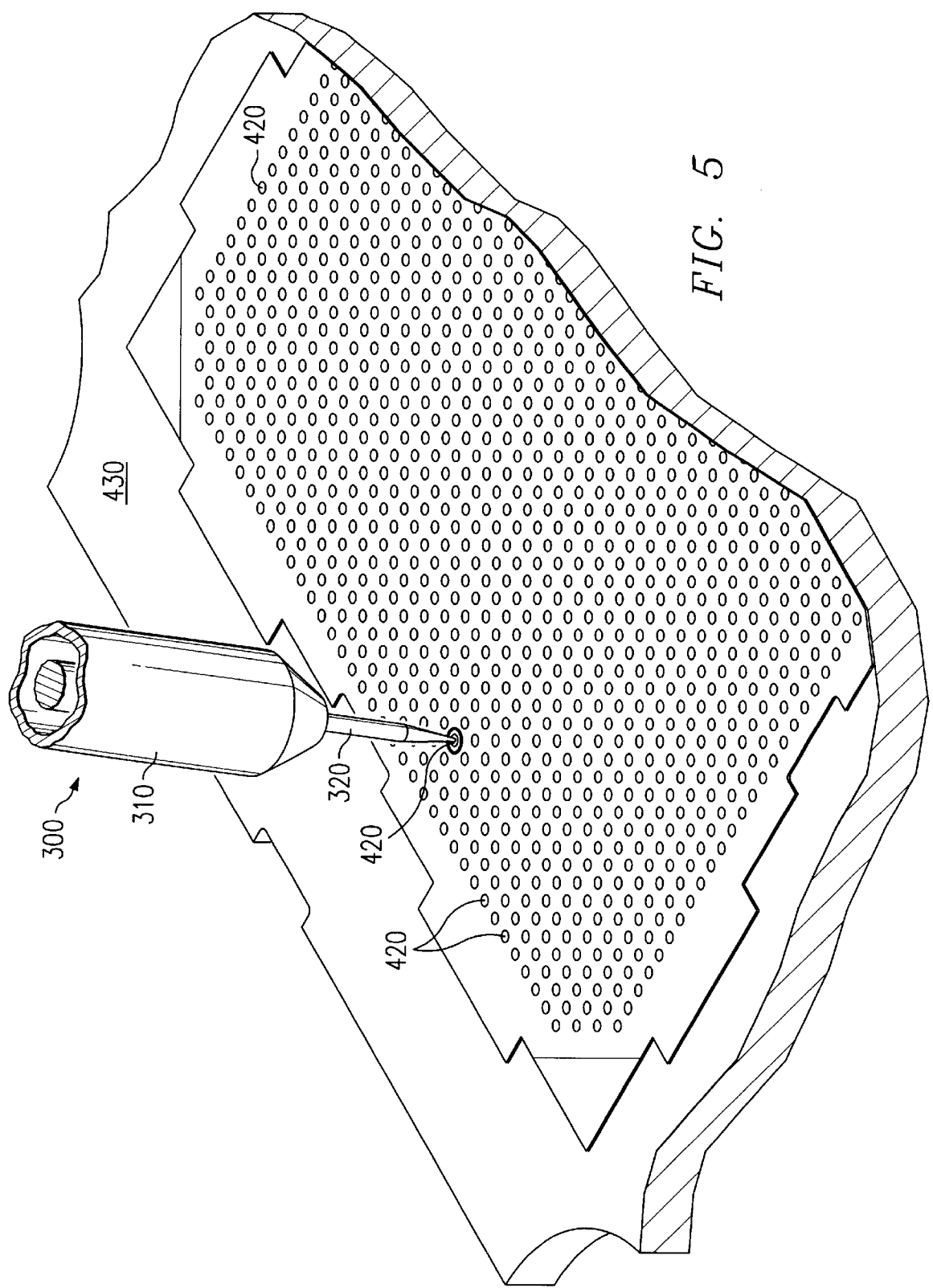
FIG. 5 is a perspective, close-up view of a probe contacting a pad through a mask of the present invention.

FIG. 5 shows how a user may manipulate probe 300 to enable probe tip 320 to contact a pad through perforated hole 420 in probe mask 430. As can be readily appreciated from the illustration of FIG. 5, second and third probes can easily be positioned in other perforated holes, such as the other two marked holes, with little effort and/or no further pad counting.

It should be appreciated that, although a preferred embodiment has been described herein with reference to a VLSI chip configuration, probe masks of the present invention may be used to probe any high density array of PCB contacts. For example, probe masks of the present invention may be configured for use with connector pins or pads.

The dimensions of the perforated probe mask are preferably substantially the same as the surface of the chip on the PCB having pads to be measured. This creates a stable work environment for the probe to access all necessary pads and keep the frame rigid during the measuring process. However, a probe mask may be sized to the dimensions of the PCB so that one probe mask may be used to probe all chips upon the PCB.

The preferred embodiment uses a frame to hold the perforated insulating sheet of the probe mask rigid and to accurately align the frame to the portion of the PCB having pad(s) to be measured. The frame may be made of insulated or conductive material.

In the preferred embodiment, the perforated insulating sheet is integrally connected to the frame. Methods of attaching the insulating sheet to the frame include pressure-sensitive adhesion, locating bosses molded into the frame which project into corresponding holes in the insulating sheet, or heat sealing or solvent welding the sheet to the frame.

The frame is adapted to use existing architecture on the PCB to hold the frame in place and ensure that the holes align with the pads on the PCB. According to this embodiment, when a user probes a pad through the probe mask, the probe does not slide off the pad because the frame is holding the insulating sheet rigid and the side wall of the perforated hole restrains the motion of the probe tip.

Another embodiment of the present invention is to use a perforated insulating sheet without a frame and adhesion means to secure the sheet to the PCB. For example, masking tape can be used.

Figure 6:
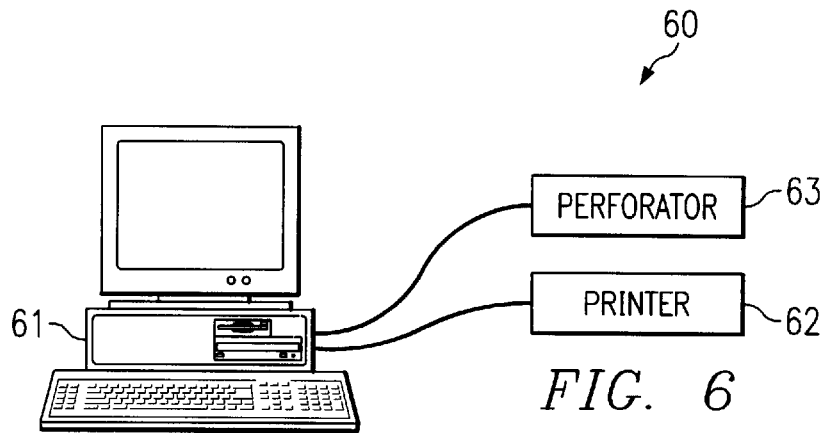
FIG. 6 shows an illustrative embodiment of a computer system and printer/perforator used to create markings on a mask.

FIG. 6 shows one embodiment of a system, such as system 60, which uses processing system 61 for generating a pattern which pattern can be used to create the holes in a probe mask or can be used to outline the probe holes in a "standard" mask. The pattern can be generated by using a standard printer, such as printer 62. Printer 62 could be a printer that actually punches the holes, (as shown by device 63), or simply prints a pattern that can be transferred or used as a mask.

Typically, the density of the printing for the mask would be about 1000 pins per square inch, with 32 pins in each direction of the matrix. Thus, any printer that can print 600 dpi will work.

Figure 7:
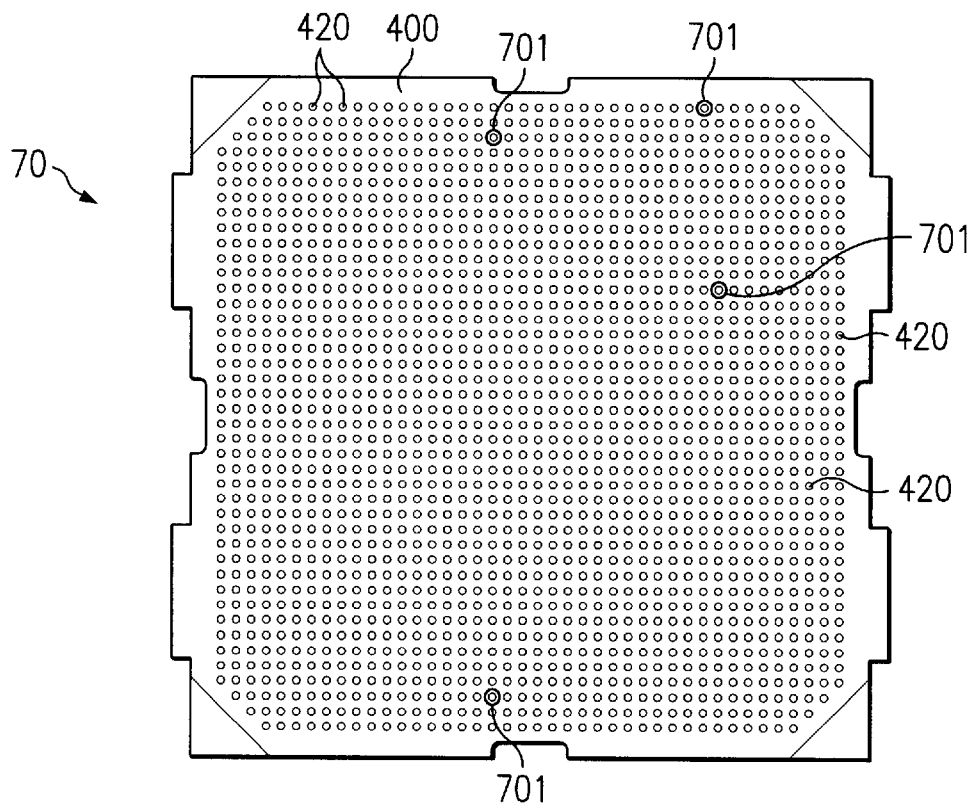
FIG. 7 shows a mask having vias positioned over a number of pads, certain of the vias being marked.

FIG. 7 shows mask 70 which is a standard mask having a matrix of pre-punched holes through substrate 400. Certain of the holes 701 are marked so that a user knows through which hole the test probe is to be placed. Markings 701 can be numbered, lettered, color coded or the like to indicate the order of testing, or the test results expected.

Figure 8:
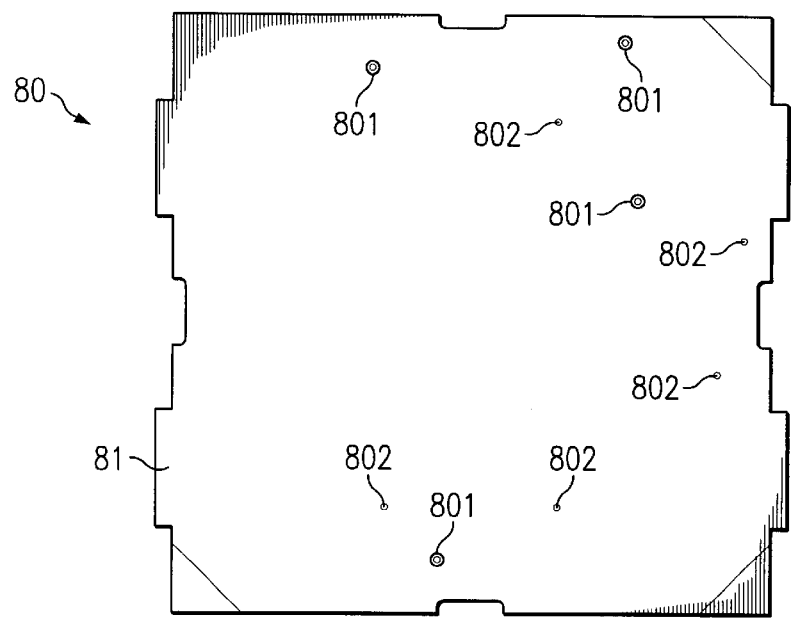
FIG. 8 shows a mask having marked vias positioned only over selected ones of the pads.

FIG. 8 shows mask 80 having holes, such as holes 801, 802 on substrate 81. Substrate 81 could be the actual mask that is to be used by the tester, or it could be an overlay, transfer or stencil that is used to punch, or mark, the proper holes on the actual testing mask.

Figure 9A:
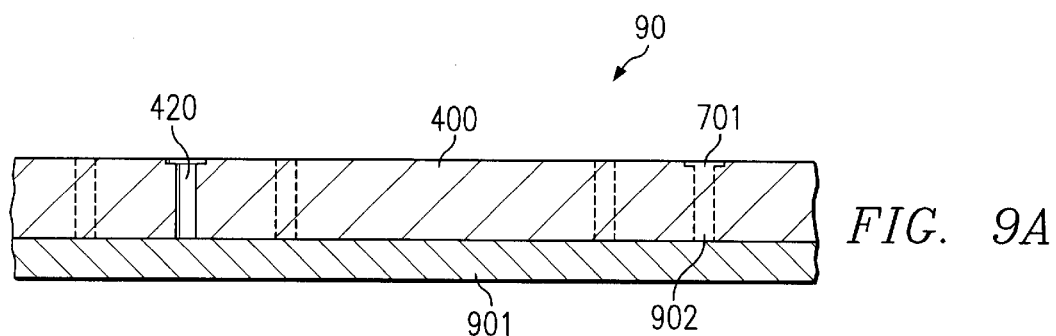
FIGS. 9A and 9B show alternative embodiments using removable sheets over the actual mask to aid in marking the mask

FIG. 9A shows test mask 400 having attached thereto, stencil 901 on the bottom surface by temporary or permanent bonding, using mechanical support, or the like. In this embodiment, desired hole 902 is open on the bottom to allow the test probe to pass through.

Figure 9B:
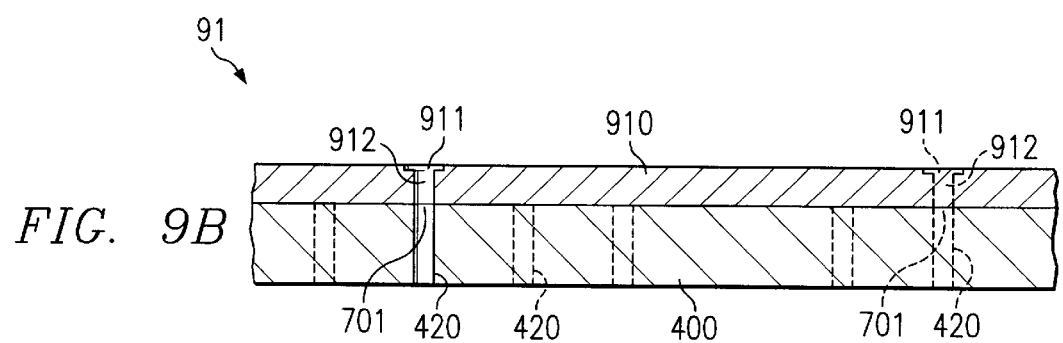

FIG. 9B shows mask 400 with stencil 910 mounted on the top surface in the manner discussed above. In this embodiment, hole (or marking) 911 is positioned over via 912. Hole (or marking) 911 is advantageously created by system 60, FIG. 6. The stencils can be printed on two-part material, where on part is "peeled" off to reveal a "sticky" surface which then can be positioned on a mask, either for the purpose of creating a stencil or permanently for testing.

What is claimed is:

1. A method of creating a mask for use in locating and accessing at least one conductive pad among a plurality of pads on a PCB to allow for the measurement of a signal on at least one of said pads, the method comprising the steps of:

creating on an insulating sheet at least one marking to assist in signal measurement, said sheet adapted to cover a plurality of said pads and having perforations corresponding to the spacing of said pads, wherein said at least one marking is a band of color positioned with respect to individual ones of said perforations; and wherein said creating step includes using a computer controlled printer.

2. The method of claim 1 wherein different colors are used to aid in said signal measurement.

3. The method of claim 1 wherein said creating step further includes the step of:

printing said markings as circles around said perforations.

4. The method of claim 1 further including the step of:

separating said insulating sheet from a second sheet of material after said creating step.

5. The method of claim 1 wherein said creating step includes the step of:

printing on a transfer sheet, said transfer sheet juxtaposed on a surface of said insulating sheet.

6. The method of claim 5 wherein said printing involves positioning ink on said transfer sheet, at least a portion of said positioned ink causing said markings on said insulating sheet.

7. The method of claim 1 further including the step of:

creating said perforations on said insulating sheet in conjunction with said creating of said marking.

8. The method of claim 1 further including the step of:

passing at least a portion of a test probe through marked perforated ones of said pads.

9. A system for creating markings on a sheet of insulating material, said insulating material adapted for acting as a mask to assist in positioning a signal measurement probe on a PCB board signal pad, said system comprising:

a printer for creating markings at specified locations on said insulating material, wherein said markings comprise a band of color, and a computer for issuing instructions to said printer, said instructions controlling the location of said markings with respect to perforations through said insulating material.

10. The system of claim 9 wherein said perforations are preformed on said insulating material.

11. The system of claim 9 wherein said perforations are created in said insulating material under control of said instructions.

12. The system of claim 9 wherein said insulating material has associated therewith a removable material.

13. The system of claim 11 wherein said markings are created, at least in part, by printing on said removable material.

14. A device to aid in locating and accessing at least one conductive pad among a plurality of pads on a PCB to measure a signal at said at least one pad using a probe, the device comprising:

an insulating sheet adapted to cover a plurality of said pads, where the signal is to be measured, said sheet having perforations corresponding to the spacing of said pads; and means for printing markings at specific locations on said insulating sheet, wherein said markings comprise bands of color.

15. The device of claim 14 wherein said creating means includes:

a transfer of markings from one medium to another.

16. The device of claim 14 wherein the perforations are identified to indicate the pad to be measured.

17. The device of claim 14 wherein said markings are only created at the locations to be measured.

18. A processing system for assisting in the creation of a device to aid in locating and accessing at least one conductive pad among a plurality of pads on a PCB to measure a signal at certain of said pads using a probe, the system comprising:

an insulating sheet having perforations corresponding the pads, where the signal is to be measured;

a color printed near individual ones of said perforations; and wherein said device is constructed using a printer controlled by a software program.

19. The device of claim 18 wherein said printer is operable to construct punctures through said insulating sheet.

* * * * *